United States Patent
Baik et al.

(10) Patent No.: US 12,372,588 B2
(45) Date of Patent: Jul. 29, 2025

(54) SYSTEM FOR DIAGNOSING BATTERY CELL BY USING DIRECT BMS

(71) Applicants: AIRPOINT CO., LTD., Daejeon (KR); Cell Point Co., LTD., Daejeon (KR)

(72) Inventors: Sung Jun Baik, Daejeon (KR); Jun Ho Cho, Daejeon (KR)

(73) Assignees: AIRPOINT Co., Ltd., Daejeon (KR); Cell Point Co., Ltd., Daejeon (KR)

( * ) Notice: Subject to any disclaimer, the term of this patent is extended or adjusted under 35 U.S.C. 154(b) by 91 days.

(21) Appl. No.: 18/332,730

(22) Filed: Jun. 10, 2023

(65) Prior Publication Data
US 2024/0302450 A1 Sep. 12, 2024

(30) Foreign Application Priority Data
Mar. 7, 2023 (KR) .................. 10-2023-0029752

(51) Int. Cl.
*G01R 31/396* (2019.01)
*G01R 31/371* (2019.01)
*G01R 31/3842* (2019.01)
*G01R 31/389* (2019.01)

(52) U.S. Cl.
CPC ......... *G01R 31/396* (2019.01); *G01R 31/371* (2019.01); *G01R 31/3842* (2019.01); *G01R 31/389* (2019.01)

(58) Field of Classification Search
None
See application file for complete search history.

(56) References Cited

U.S. PATENT DOCUMENTS

| | | | |
|---|---|---|---|
| 2013/0308679 A1* | 11/2013 | Choi | H01M 10/425 374/152 |
| 2016/0105042 A1* | 4/2016 | Taylor | H01M 10/482 320/134 |
| 2016/0294019 A1* | 10/2016 | Yamauchi | H01M 10/48 |
| 2020/0059106 A1* | 2/2020 | Karlsson | H01M 10/425 |
| 2020/0412146 A1* | 12/2020 | Takechi | H02J 7/005 |
| 2024/0154445 A1* | 5/2024 | Ashrafzadeh | H01M 10/425 |

FOREIGN PATENT DOCUMENTS

| KR | 10-2014-0013760 | 2/2014 |
|---|---|---|
| KR | 10-2203-247 | 4/2019 |
| KR | 10-2019-0092088 | 8/2019 |

OTHER PUBLICATIONS

Office Action for Korea Patent Application No. 10-2023-0029752, mailed Sep. 20, 2024.
Notice of Allowance for Korea Patent Application No. 10-2023-0029752, mailed Feb. 24, 2025.

* cited by examiner

*Primary Examiner* — Jas A Sanghera

(57) ABSTRACT

The present invention relates to a system for diagnosing a battery cell by using a direct BMS, and more particularly, to a system for diagnosing a battery cell by using a direct BMS, in which the direct BMS physically and electrically makes direct contact with an electrode of each of battery cells to measure a voltage of each of the battery cells and currents of the battery cells, calculate an impedance of each of the battery cells based on the measured voltage and the measured current, diagnose a state of each of the battery cells through the impedance, and wirelessly transmit a diagnosis result to a master BMS.

6 Claims, 16 Drawing Sheets

SYSTEM FOR DIAGNOSING BATTERY CELL BY USING DIRECT BMS

BACKGROUND OF THE INVENTION

1. Field of the Invention

The present invention relates to a system for diagnosing a battery cell by using a direct BMS, and more particularly, to a system for diagnosing a battery cell by using a direct BMS, in which the direct BMS physically and electrically makes direct contact with an electrode of each of battery cells to measure a voltage of each of the battery cells and currents of the battery cells, calculate an impedance of each of the battery cells based on the measured voltage and the measured current, diagnose a state of each of the battery cells through the impedance, and wirelessly transmit a diagnosis result to a master BMS.

2. Description of the Related Art

Recently, as a demand for electric vehicles rapidly increases, interest in battery packs used in electric vehicles and hybrid vehicles is increasing according to the increasing demand. Since a battery requires high performance such as safe operability in harsh environments or for a long time, hundreds or thousands of battery cells constituting the battery pack have to be precisely managed at all times. A battery pack mounted on a vehicle or the like may generally include a plurality of battery modules and a plurality of slave battery management systems (BMSs), which are connected in series and/or parallel to each other, and each of the battery modules may include a plurality of battery cells. Each of the slave BMSs may monitor and control a state of a battery module, which is designated to the slave BMS so as to be managed by the slave BMS. Recently, as a large-capacity and high-output battery pack is required, the number of battery modules included in the battery pack is also increasing. According to the development of such technologies, a technology for a battery management system has been developed in order to efficiently manage each of the battery modules included in the battery pack.

According to the related art, an average voltage, an average current, and an average temperature of all battery cells are measured for a battery module including a plurality of battery cells, and states of the battery cells are diagnosed based on the average voltage, the average current, and the average temperature of all the battery cells. In this case, it is difficult to take action on a specific battery cell that causes a problem, so that reliability of a diagnosis result for the battery cell may be lowered.

In addition, according to the related art, a battery cell, a slave BMS, and a master BMS are connected to each other in a wired manner to perform communication. However, it is necessary to switch channels for multiplexing (muxing) of data during the communication between the slave BMS and the master BMS upon the wired connection. During such a process, a noise may be generated so that reliability of the data transmitted and received between the slave BMS and the master BMS may be lowered. In addition, according to the related art, there is a problem in that a separation element (isolator) for separating signal components are required to be applied or installed in a plurality of positions in order to prevent electromagnetic interference (EMI) from being induced through a wire connected upon the wired connection. In order to solve such a problem, recently, a technology for performing wireless communication between a slave BMS and a master BMS, such as Korean Patent Registration No. 10-2203247, has been developed. However, the technology corresponds to merely a technology for performing wireless connection only on communication between the slave BMS and the master BMS while a battery cell and the slave BMS are connected to each other in a wired manner, so that a problem in the wired connection between the battery cell and the slave BMS may still occur. Mutually different voltages may flow through battery cells included in a single battery module, so that mutually different noises may be generated in the battery cells. In this case, the generated noises may vary according to a voltage and the performance of the battery cell, so that signals output from the battery cells may not be corrected. In addition, similar to the noise caused by the multiplexing (muxing) during the communication between the slave BMS and the master BMS described above, a noise may also be generated during multiplexing (muxing) between the battery cell and the slave BMS, and the separation element (isolator) described above may not completely remove the electromagnetic interference due to limitations in a cost and an installation area so that interference components and the like may be generated. Accordingly, due to the noise applied to normal data, reliability of the data transmitted and received between the battery cell and the slave BMS may be lowered. In other words, even in a technology related to a BMS performing wireless communication as in the related art, various problems caused by conventional wired communication have not been resolved.

Therefore, there is a demand for developing a technology capable of increasing reliability of a battery management system by diagnosing performance of each of battery cells and reducing a noise generated during communication so that the battery cell may be safely operated.

DOCUMENTS OF RELATED ART

Patent Documents (Patent Document 1) Korean Patent Registration No. 10-2203247 (Jan. 8, 2021)

SUMMARY OF THE INVENTION

An object of the present invention is to provide a system for diagnosing a battery cell by using a direct BMS, in which the direct BMS physically and electrically makes direct contact with an electrode of each of battery cells to measure a voltage of each of the battery cells and currents of the battery cells, calculate an impedance of each of the battery cells based on the measured voltage and the measured current, diagnose a state of each of the battery cells through the impedance, and wirelessly transmit a diagnosis result to a master BMS.

To achieve the object described above, according to one aspect of the present invention, there is provided a system for diagnosing a battery cell, the system including: a plurality of direct battery management systems (BMSs) located inside the vehicle, and electrically connected to a plurality of battery cells included in a battery module; and a master BMS located inside the vehicle, and configured to perform wireless communication with the direct BMS, wherein the direct BMS includes: a battery cell connection unit including a port physically and electrically making direct contact with an exposed electrode of the battery cell; a voltage measurement unit electrically connected to the battery cell connection unit to measure a voltage of the battery cell in a form of a circuit;

a current measurement unit electrically connected to the battery cell connection unit to measure a current of the battery cell in a form of a circuit; a diagnosis unit configured to diagnose abnormality of the battery cell based on voltage information, current information, and temperature information, which are measured; and a first wireless communication unit configured to transmit a diagnosis result of the diagnosis unit to the master BMS, and the diagnosis result transmitted from the first wireless communication unit is received by a second wireless communication unit of the master BMS.

According to one embodiment, both positive and negative terminals of the battery cell may make direct contact with the port included in the battery cell connection unit, the voltage of each of the battery cells and the current of each of the battery cells may be measured, a state of the battery cell may be diagnosed for each of the battery cells, and the diagnosis result of each of the battery cells may be transmitted to the master BMS.

According to one embodiment, the direct BMS may be configured to: analyze the voltage of each of the battery cells and the current of the battery cell to measure an impedance of each of the battery cells; perform fire diagnosis based on the impedance of each of the battery cells; and transmit a fire diagnosis result to the master BMS.

According to one embodiment, the direct BMS may further include: a cell balancing unit configured to adjust a voltage difference between the battery cells to set the voltages of the battery cells to be equal to each other; and an impedance calculation unit configured to calculate an impedance of each of the battery cells based on the voltage and the current of the battery cell.

According to one embodiment, the direct BMS may be configured as one substrate, and the battery cell connection unit, the voltage measurement unit, the current measurement unit, a temperature measurement unit, the diagnosis unit, the first wireless communication unit, the cell balancing unit, and the impedance calculation unit may be configured on a same substrate.

According to one embodiment, the direct BMS may further include a plurality of cell balancing elements, the cell balancing element may include a cell switching element and a cell power storage element, and the cell balancing elements may be configured to perform cell balancing between adjacent battery cells.

According to one embodiment, the battery module may include the battery cells connected in series to each other, and a positive terminal and a negative terminal may be arranged on one side surface of each of the battery cells.

According to one embodiment of the present invention, the direct BMS may physically and electrically make direct contact with the battery cells to receive electrical signals, so that a noise can be prevented from being generated by channel switching in wired communication, and thus reliability of data received from the battery cells can be increased.

According to one embodiment of the present invention, the direct BMS may physically and electrically make direct contact with the battery cells to receive the electrical signals, so that an uncorrectable noise can be prevented from being generated by mutually different voltages of the battery cells, and thus the reliability of the data received from the battery cells can be increased.

According to one embodiment of the present invention, each electrode of the battery cell may be connected to the port of the battery cell connection unit of the direct BMS to measure the voltage corresponding to each of the battery cells. In this case, a wire in which electromagnetic interference occurs can be eliminated, so that accuracy of the data for each of the battery cells can be increased, and a user can rapidly take action on a battery cell that is determined to have a problem as a result of diagnosing each of the battery cells.

According to one embodiment of the present invention, the impedance corresponding to each of the battery cells may be measured through cell balancing, and the state of the battery cell may be diagnosed based on the measured impedance, so that the user can prepare for an accident such as battery explosion.

According to one embodiment of the present invention, the battery module and direct BMS may be physically connected to each other, so that the system for diagnosing the battery cell can have improved durability against vibration as compared with a conventional battery management system, resulting in extension of a lifespan of a battery, and reliability of data that is transmitted and received can also be increased.

DETAILED DESCRIPTION OF THE INVENTION

Figure 1:
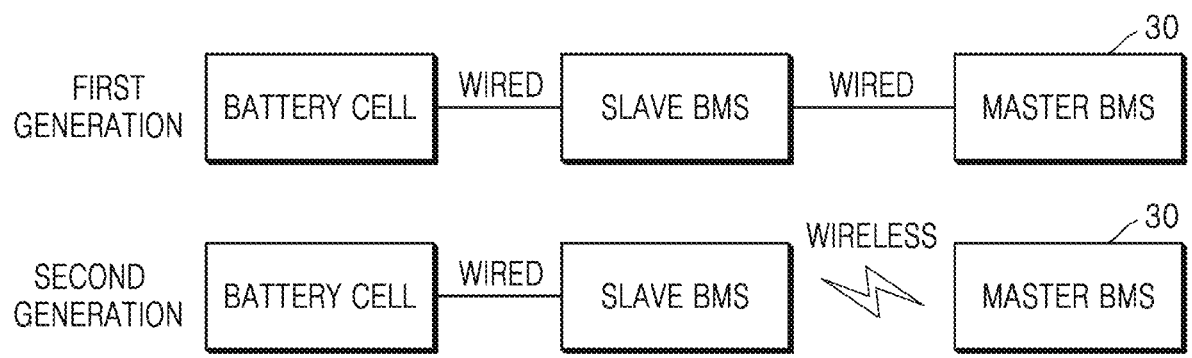
FIG. 1 is a view schematically showing a communication method between a battery cell and a battery management system according to the related art.

Hereinafter, various embodiments and/or aspects will be described with reference to the drawings. In the following description, numerous specific details are set forth in order to provide a thorough understanding of one or more aspects for the purpose of explanation. However, it will also be appreciated by a person having ordinary skill in the art that such aspect(s) may be carried out without the specific details. The following description and accompanying drawings will be set forth in detail for specific illustrative aspects among one or more aspects. However, the aspects are merely illustrative, some of various ways among principles of the various aspects may be employed, and the descriptions set forth herein are intended to include all the various aspects and equivalents thereof.

In addition, various aspects and features will be presented by a system that may include a plurality of devices, components and/or modules or the like. It will also be understood and appreciated that various systems may include additional devices, components and/or modules or the like, and/or may not include all the devices, components, modules or the like recited with reference to the drawings.

The term "embodiment", "example", "aspect", "exemplification", or the like as used herein may not be construed in that an aspect or design set forth herein is preferable or advantageous than other aspects or designs. The terms 'unit', 'component', 'module', 'system', 'interface' or the like used in the following generally refer to a computer-related entity, and may refer to, for example, hardware, software, or a combination of hardware and software.

In addition, the terms "include" and/or "comprise" specify the presence of the corresponding feature and/or component, but do not preclude the possibility of the presence or addition of one or more other features, components or combinations thereof.

In addition, the terms including an ordinal number such as first and second may be used to describe various components, however, the components are not limited by the terms. The terms are used only for the purpose of distinguishing one component from another component. For example, the first component may be referred to as the second component without departing from the scope of the present invention, and similarly, the second component may also be referred to as the first component. The term "and/or" includes any one of a plurality of related listed items or a combination thereof.

In addition, in embodiments of the present invention, unless defined otherwise, all terms used herein including technical or scientific terms have the same meaning as commonly understood by those having ordinary skill in the art. Terms such as those defined in generally used dictionaries will be interpreted to have the meaning consistent with the meaning in the context of the related art, and will not be interpreted as an ideal or excessively formal meaning unless expressly defined in the embodiment of the present invention.

FIGS. 1 to 4 are views schematically showing a communication method between a battery cell and a battery management system according to the related art, and problems occurring in the related art.

Figure 2:
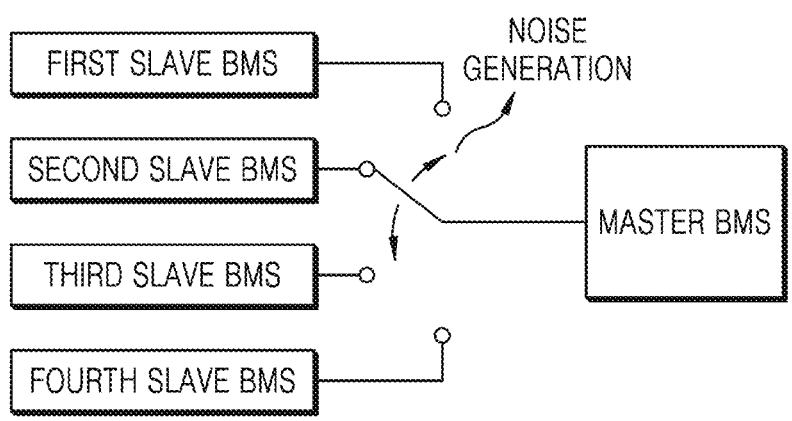
FIG. 2 is a view schematically showing a problem occurring in a multiplexing (muxing) process according to the related art.
Figure 3:
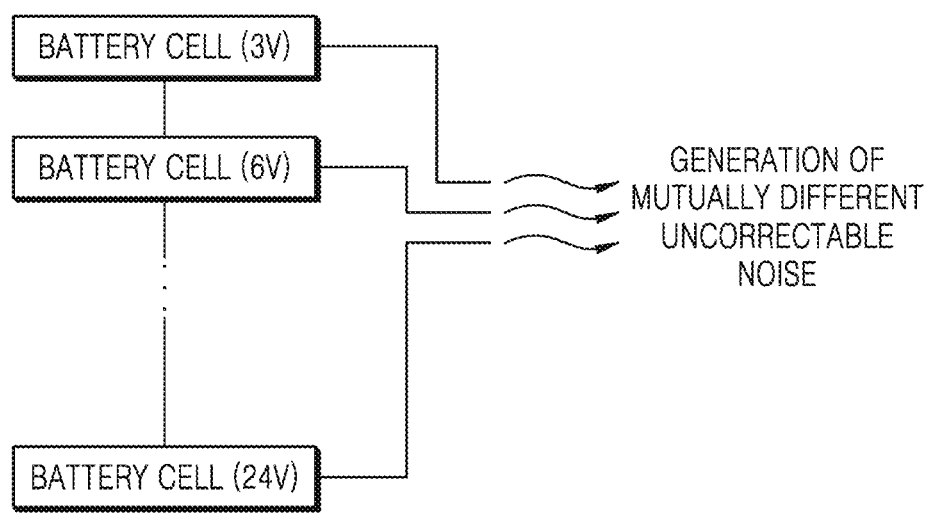
FIG. 3 is a view schematically showing a problem caused by battery cells from which mutually different voltages are measured according to the related art.
Figure 4:
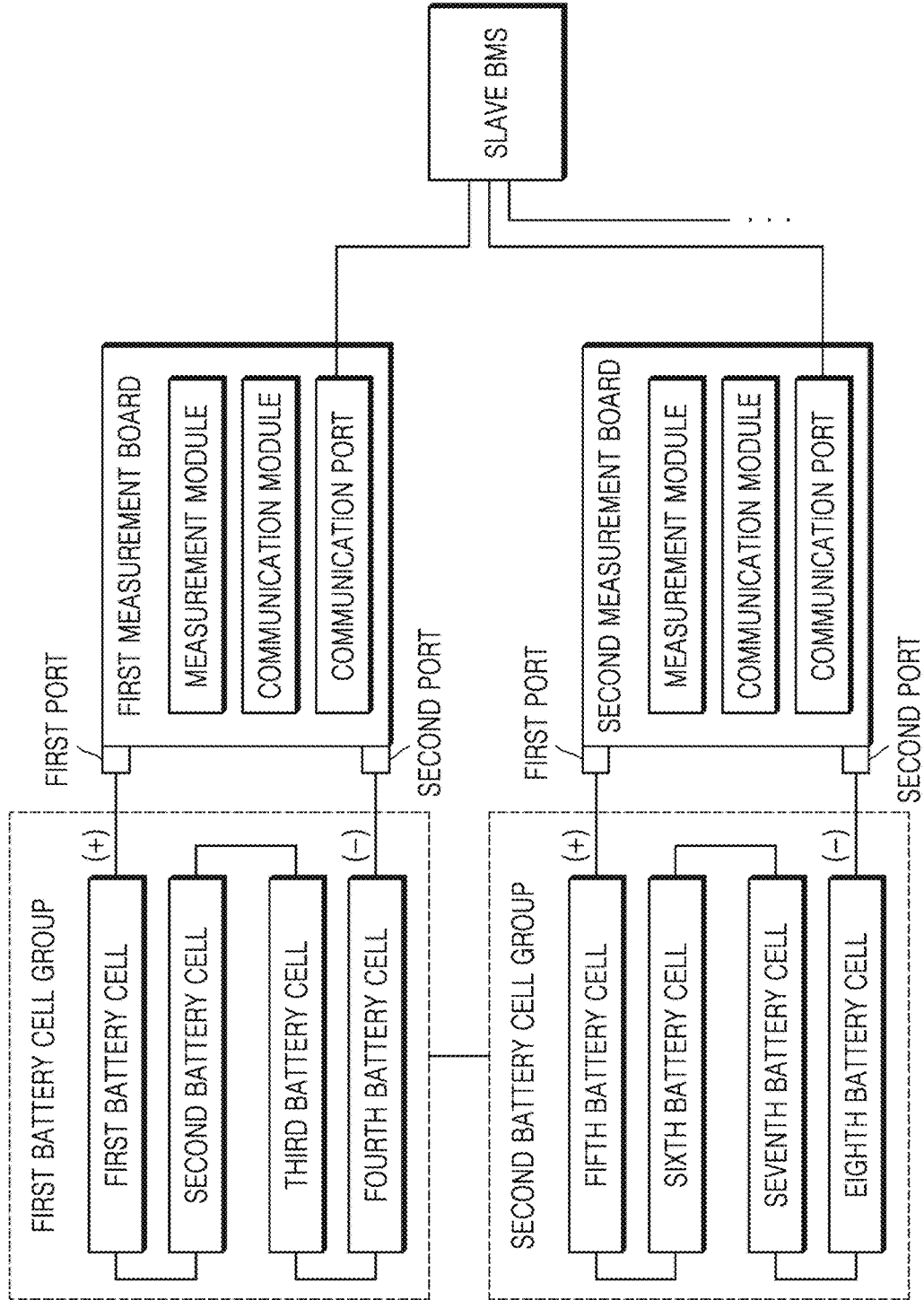
FIG. 4 is a view schematically showing a problem caused by battery cell groups from which mutually different voltages are measured according to the related art.

Schematically, FIG. 1 is a view showing first-generation and second-generation communication methods among a battery cell, a slave BMS, and a master BMS 30 according to the related art, FIG. 2 is a view showing a noise generated by channel switching required for multiplexing (muxing) during wired communication, FIG. 3 is a view showing a noise generated by electrical floating during wired communication between the slave BMS and battery cells from which mutually different voltages are measured, and FIG. 4 is a view schematically showing a problem occurring during wired communication between the slave BMS and battery cell groups from which mutually different voltages are measured.

In detail, as shown in FIG. 1, according to a conventional first-generation battery management system, a battery cell and a slave BMS may be connected to each other in a wired manner to perform communication, and the slave BMS and a master BMS 30 may also be connected to each other in a wired manner to perform communication.

According to the communication method in the first-generation battery management system, as shown in FIG. 2, a plurality of slave BMSs may be connected to a single master BMS 30, and the single master BMS 30 may sequentially receive signals from the slave BMSs to multiplex (mux) the signals.

The problems that the inventor of the present invention have derived from the first-generation battery management system will be described as follows.

While the master BMS 30 performs multiplexing (muxing), connection of the slave BMSs to the master BMS 30 may be sequentially switched to perform the communication. For example, when a first slave BMS is connected to the master BMS 30, a channel (or a switch) between the first slave BMS and the master BMS 30 may be in an on-state, and channels between the master BMS 30 and the remaining slave BMSs except for the first slave BMS may be in an off-state.

Next, when a channel of a second slave BMS is in an on-state, the channels of the remaining slave BMSs except for the second slave BMS may be in an off-state, and the same process may be performed on a third slave BMS, a fourth slave BMS, and the like until a last slave BMS.

As described above, a noise may be inevitably generated in a switching process in which connection switches between the master BMS 30 and the slave BMSs are sequentially turned on/off, so that data transmitted and received between the slave BMS and the master BMS 30 may become inaccurate, and thus reliability of the data may be lowered.

In order to solve such a problem, recently, a technology for performing wireless communication between a slave BMS and a master BMS 30, such as the second-generation communication method shown in FIG. 1, has been developed.

However, even in this case, a plurality of battery cells may be grouped, and signal output lines of the grouped battery cells may be connected to a single slave BMS.

In other words, even in this case, basically, a single slave BMS may be connected to a plurality of signal lines from the battery cell groups, and similarly, the noise generation problem caused by rapid switching on/off in FIG. 2 may occur when the slave BMS receives signals from the grouped battery cells through the signal lines.

For example, when assuming that there are a total of 25 battery cells, according to a conventional second-generation technology, voltages and currents of all five battery cells may be measured, and signals obtained through the measurement may be transmitted to the slave BMS through separate wired communication. Therefore, the slave BMS may receive information through a total of five signal lines for the 25 battery cells, and in this process, a noise caused by a switching operation as shown in FIG. 2 may be generated.

In addition, as shown in FIG. 3, for example, in a case where a voltage of 3 V is applied to one battery cell, when a plurality of battery cells are connected in series, a higher voltage may be applied to the battery cell at a rear end as compared with the battery cell at a front end.

In other words, the battery cells may have mutually different voltages, and due to each of the mutually different voltages, a noise may be generated based on mutually different voltages applied to the battery cells during the wired communication.

In addition, a characteristic of the noise may vary according to the voltage, a lifespan of the battery cell, and presence/absence of vibration, so that the noise may affect an existing data signal while being uncorrectable under a common rule. For example, since a noise canceling scheme for a battery cell to which a voltage of 3 V is applied is different from a noise canceling scheme for a battery cell to which a voltage of 24 V is applied, a signal may not be accurately received from the battery cell.

FIG. 4 is a view showing a latest version of a second-generation battery management system to which wireless connection is partially applied as described above.

In FIG. 4, a battery cell group including a plurality of battery cells (four battery cells in FIG. 4) may be connected to a measurement board. The measurement board may be connected to a first electrode of a first battery cell, which corresponds to a first battery cell among the battery cells, and a second electrode of a fourth battery cell, which corresponds to a last battery cell (a fourth battery cell in FIG. 4) among the battery cells, and a measurement module of the measurement board may measure a voltage for series connection of four battery cells and the like.

Information obtained through the measurement by the measurement module may be signal-processed by a communication module, and connection may be established to the slave BMS through a communication port in a wired communication scheme.

In such an environment, the slave BMS may be connected to a plurality of measurement boards, and may receive a measurement value for each battery cell group (four battery cells in FIG. 4) from each of the measurement boards.

In this case, the slave BMS has to receive accurate data by removing the noise generated during a channel switching process in a muxing step described above and the noise generated by the voltage applied to each of the battery cell groups, which may not be practically resolved.

In particular, in FIG. 4, a voltage of 3 V*4, that is, 12 V, may be applied to the fourth battery cell, which is a last battery cell of a first battery cell group (e.g., a voltage difference between a ground voltage of the measurement board and the last battery cell), and a voltage of 24 V may be applied to an eighth battery cell, which is a last battery cell of a second battery cell group. When there are hundreds of battery cells, a difference in a voltage applied to the battery cell group may become very large, so that a noise caused by the large voltage difference has to be compensated in mutually different ways or to mutually different degrees, which is practically impossible. As described above, when the mutually different voltages are applied, data communication as well as voltage/current measurement may be affected.

According to the first-generation and second-generation battery management systems described above, reliability of data may be inevitably low.

According to the present invention, a novel architecture of a direct BMS other than a second-generation connection structure between a battery cell and a slave BMS may be introduced to prevent data errors caused by a noise and the like, so that information on at least one battery cell may be accurately measured, and accurately transmitted.

Figure 5:
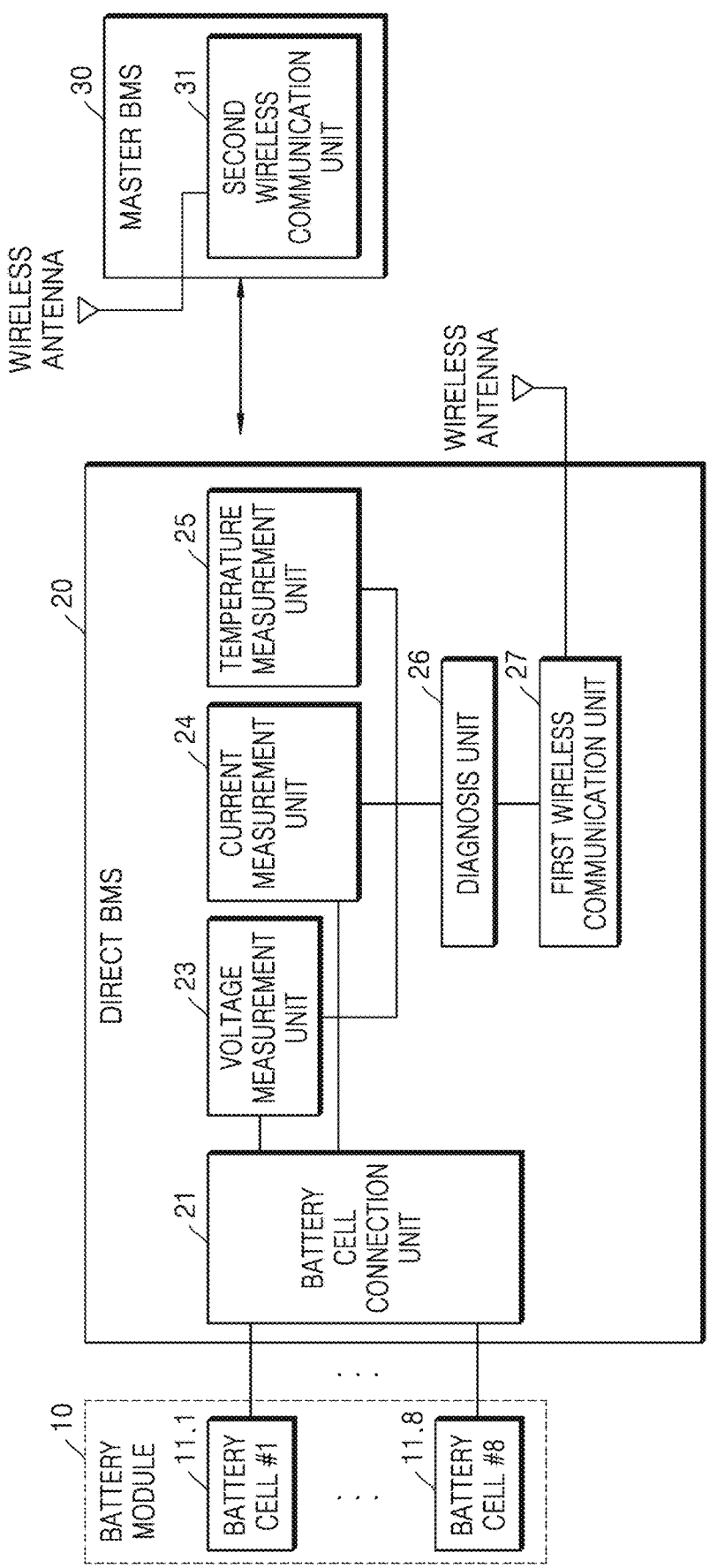
FIG. 5 is a view schematically showing a configuration of a system for diagnosing a battery cell by using a direct BMS according to one embodiment of the present invention.

FIG. 5 is a view schematically showing a configuration of a system for diagnosing battery cells 11.1 to 11.8 (hereinafter referred to as "11") by using a direct BMS 20 according to one embodiment of the present invention.

As shown in FIG. 5, a system for diagnosing a battery cell 11 may include: a plurality of direct battery management systems (BMSs) 20 electrically connected to a plurality of battery cells 11 included in a battery module 10; and a master BMS 30 configured to perform wireless communication with the direct BMS 20, wherein the direct BMS 20 includes: a battery cell connection unit 21 including a port physically and electrically making direct contact with an exposed electrode of the battery cell 11; a voltage measurement unit 23 electrically connected to the battery cell connection unit 21 to measure a voltage of the battery cell 11 in a form of a circuit; a current measurement unit 24 electrically connected to the battery cell connection unit 21 to measure a current of the battery cell 11 in a form of a circuit; a diagnosis unit 26 configured to diagnose abnormality of the battery cell 11 based on voltage information, current information, and temperature information, which are measured; and a first wireless communication unit 27 configured to transmit a diagnosis result of the diagnosis unit 26 to the master BMS 30, and the diagnosis result transmitted from the first wireless communication unit 27 is received by a second wireless communication unit 31 of the master BMS 30.

In addition, the direct BMS 20 may be substantially configured as one substrate, and the battery cell connection unit 21, the voltage measurement unit 23, the current measurement unit 24, a temperature measurement unit 25, the diagnosis unit 26, and the first wireless communication unit 27 may be configured on the same substrate.

The battery cell may correspond to a battery cell used as a power energy supply device in an electric vehicle or a hybrid vehicle.

In detail, the present invention may include: a battery cell 11; and a battery management system (BMS) configured to manage a battery pack or a battery module including a plurality of battery cells 11.

In general, a battery may be configured as a cell, a module, and a pack. First, the battery cell 11 may be a basic unit of a lithium ion battery that may be used while charging and discharging electric energy, and the battery cell 11 may be manufactured by inserting a positive electrode, a negative electrode, a separator, and an electrolyte into a rectangular or cylindrical aluminum case.

The battery cell 11 has to have a high capacity per unit volume or per unit weight so that maximum performance may be exhibited in a limited space. Further, a vehicle battery cell may be designed to have a much longer lifespan than a general mobile device battery, withstand an impact transmitted while travelling, and have sufficient reliability and stability to operate normally at high temperatures less than or equal to a predetermined reference and at low temperatures greater than or equal to a predetermined reference.

A plurality of cells as described above may be bundled in a predetermined number so as to be protected from an external impact such as heat and vibration, and put into a frame to manufacture one battery assembly, which is referred to as a battery module 10. One battery module 10 may include about 6 to 10 cells, and recently, a module in which about 12 to 48 cells are connected in series or parallel may be used. The battery module 10 including 12 battery cells 11 may generally have a capacity of 2 to 3 kWh.

Several battery modules 10 as described above may be collected, and the BMS, a cooling device, and the like may be added so as to configure a battery pack. One battery pack may include 8 to 40 battery modules 10, and the battery modules 10 may be connected in series or parallel, or may be in a mixed form including series and parallel connections. Usually, one battery pack may be mounted on one vehicle. As described above, through a modularized battery pack, maintenance and repair of a battery may be facilitated, and a more efficient battery having a reduced weight and a reduced volume may be used.

Meanwhile, according to the present invention, for the battery cells 11 included in one battery module 10, diagnosis may be performed on each of the battery cells 11 through the direct BMS 20 that physically and electrically makes contact with each of the battery cells 11, and an accident may be prevented. Hereinafter, such a configuration will be described.

Although the battery module 10 shown in FIG. 5 includes eight battery cells 11 according to one embodiment of the present invention, a battery module 10 may include, but is not limited to, less than eight battery cells 11 or at least eight battery cells 11 according to another embodiment of the present invention.

According to another embodiment of the present invention, a direct BMS may be provided for each of the battery cells to make one-to-one correspondence.

According to the present invention, one master BMS 30 may wirelessly communicate with a plurality of direct BMSs 20, and may transmit and receives data with each of the direct BMSs 20.

Figure 8:
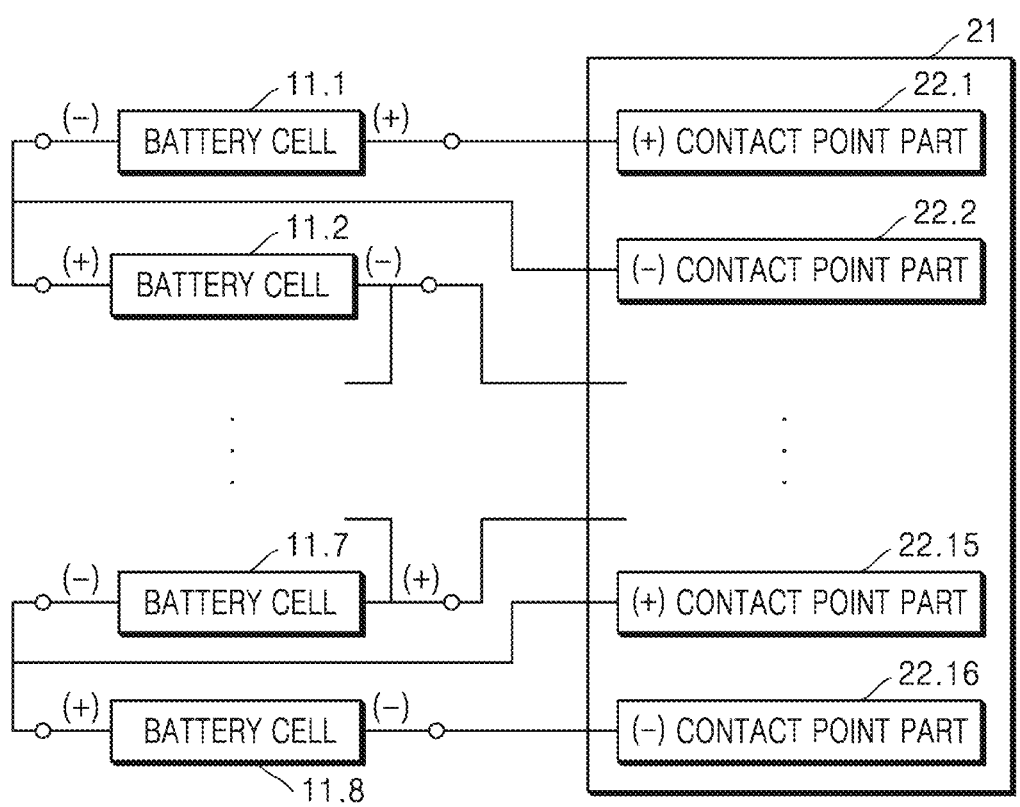

Referring to FIG. 8, the battery cell connection unit 21 may include a plurality of positive (+) electrode contact point parts 22.A (where A is an odd number, hereinafter referred to as "22.1") and a plurality of negative (−) electrode contact point parts 22.B (where B is an even number, hereinafter referred to as "22.2"), and may exclude an electromagnetic interference separation element (EMI isolator) included in a conventional battery management system. The positive electrode contact point part 22.1 and the negative electrode contact point part 22.2 may be ports physically and electrically making direct contact with the exposed electrode of the battery cell 11 to transmit and receive electrical signals between the battery cell 11 and the direct BMS 20.

In this case, since the electrical signals are not collected into a separate signal processing port and transmitted to a specific processing unit (e.g., an MCU), the electric signal received by the direct BMS 20 or a processing module inside the direct BMS 20 may be a signal that is based on a current or a voltage flowing in the battery cell 11, and such a signal may correspond to a raw signal that is not interfered with by an external factor. The positive electrode contact point part 22.1 may make contact with a positive terminal of the battery cell 11, and the negative electrode contact point part 22.2 may make contact with a negative terminal of the battery cell 11. In addition, the direct BMS 20 may be electrically connected to the battery cells 11 included in the battery module 10, and the positive electrode contact point part 22.1 and the negative electrode contact point part 22.2 may make contact with the electrode of each of the battery cells 11, so that the battery cell connection unit 21 may transmit and receive the electrical signals to and from each of the battery cells 11.

Such a raw signal may be directly transmitted to the direct BMS 20, and the measurement units inside the direct BMS 20 may perform accurate measurement based on the raw signal and transmit a measurement result to the master BMS 30 in a wireless communication scheme, so that diagnosis and data communication may be performed more accurately. According to a first-generation or second-generation scheme of FIG. 1 described above, a loss may occur in a process of transmitting data or a signal to the slave BMS, so that such accurate diagnosis and data communication may not be performed.

The voltage measurement unit 23 and the current measurement unit 24 may measure a voltage of each of the battery cells 11 and a current of the battery module 10 based on the electrical signal of each of the battery cells 11 received from the battery cell connection unit 21. A state of each of the battery cells 11 may be diagnosed through voltage information corresponding to each of the battery cells 11 and current information of the battery module 10, so that reliability of the diagnosis result may be increased.

In more detail, a voltage and a current of the battery cell 11 may be measured over time, so that a waveform of an output voltage of the battery cell 11 over time and a waveform of an output current of the battery cell 11 over time may be measured.

According to one embodiment of the present invention, the direct BMS 20 may include the temperature measurement unit 25, and the temperature measurement unit 25 may measure a temperature of the battery cell 11. The battery cell 11 may not be charged at low temperatures, and the battery cell 11 may have a failure due to a sudden temperature change, so that it is necessary to frequently measure the temperature of the battery cell 11. In addition, the temperature information of the battery cell 11 may also be a factor to be considered together with the voltage information and the current information of the battery cell 11 when diagnosing the state of the battery cell 11.

The diagnosis unit 26 may diagnose the state of each of the battery cells 11 based on the voltage information received from the voltage measurement unit 23, the current information received from the current measurement unit 24, and the temperature information received from the temperature measurement unit 25. For example, an abnormal state of the battery cell 11 may include an overvoltage (overcharging), an undervoltage (overdischarging), an overcurrent, an ultra-high temperature, and an ultra-low temperature of the battery cell 11.

Figure 13:
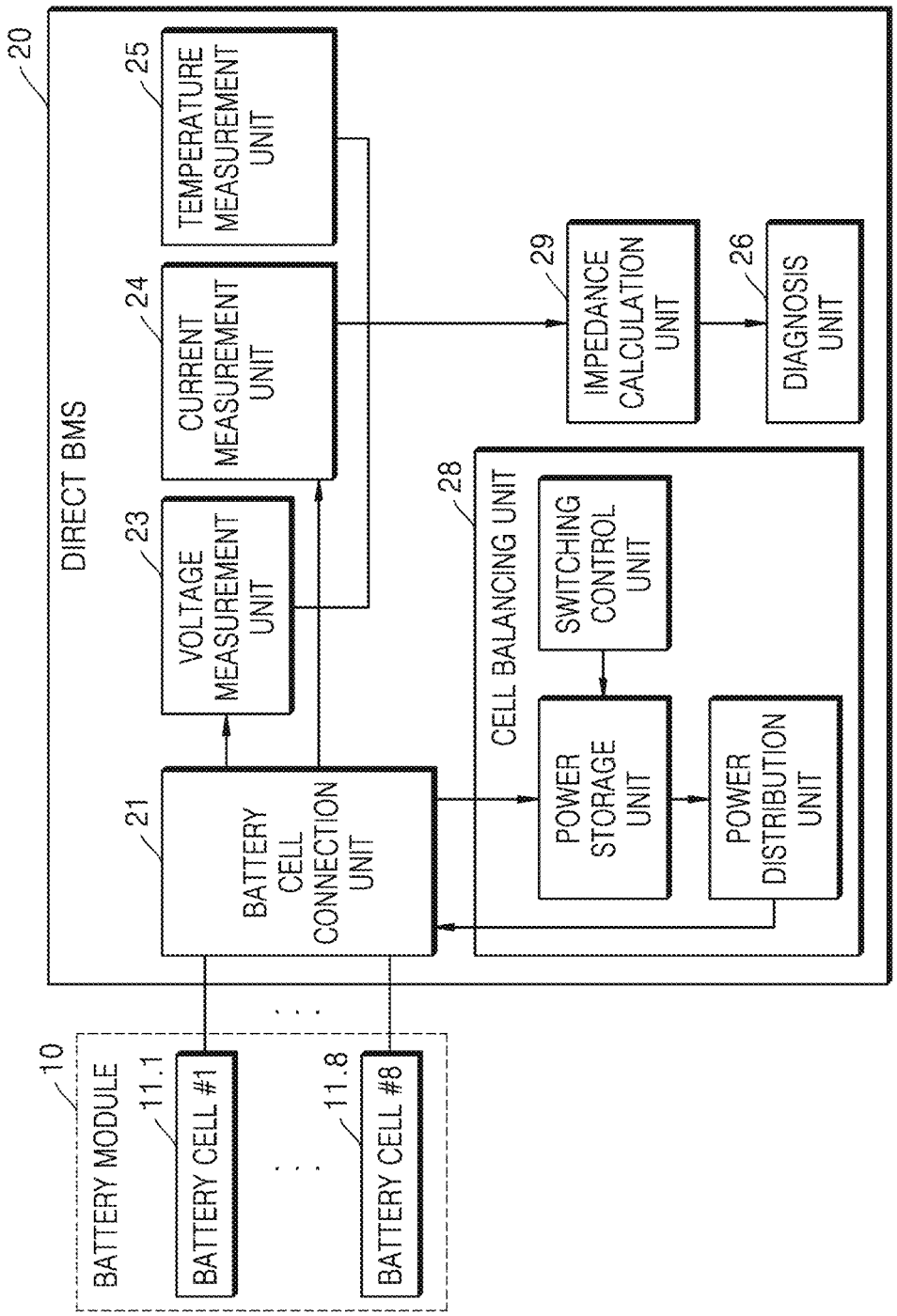
FIGS. 13 and 14 are views schematically showing a configuration of the direct BMS to perform a process of calculating an impedance of each of battery cells through cell balancing according to one embodiment of the present invention.

In more detail, referring to FIG. 13, the direct BMS 20 may further include: a cell balancing unit 28 configured to perform cell balancing; and an impedance calculation unit 29 configured to calculate an impedance through the cell balancing, and the state of each of the battery cells 11 may be diagnosed through the calculated impedance.

Preferably, the cell balancing unit 28 may additionally generate an input signal having a specific frequency through the cell balancing, and the impedance calculation unit 29 may calculate an impedance of each of the battery cells 11 through a trained artificial neural network-based inference model based on the voltage information, the current information, frequency information on the specific frequency, and the temperature information.

An impedance calculation process will be described in more detail below with reference to FIG. 14. The diagnosis unit 26 may diagnose each of the battery cells 11 through the impedance of each of the battery cells 11, so that the reliability of the diagnosis result of the battery cell 11 may be increased, and a battery accident such as a fire may be prevented.

Referring again to FIG. 5, the first wireless communication unit 27 of the direct BMS 20 may be connected to a wireless antenna of the direct BMS 20, and the second wireless communication unit 31 of the master BMS 30 may be connected to a wireless antenna of the master BMS 30.

The direct BMS 20 and the master BMS 30 may perform wireless communication with each other through the wireless antenna of the direct BMS 20 and the wireless antenna of the master BMS 30. Although not shown in FIG. 5, preferably, the second wireless communication unit 31 of the master BMS 30 may transmit and receive a signal to and from each of first wireless communication units 27 of a plurality of direct BMSs 20.

Figure 6:
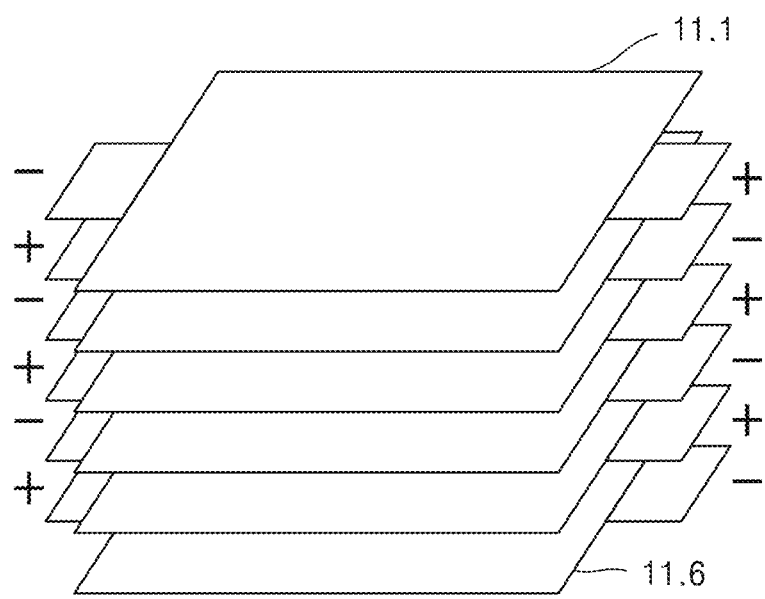
FIGS. 6 to 8 are views exemplarily showing a structure of a battery module and a connection structure between the battery module and the direct BMS according to one embodiment of the present invention.
Figure 7:
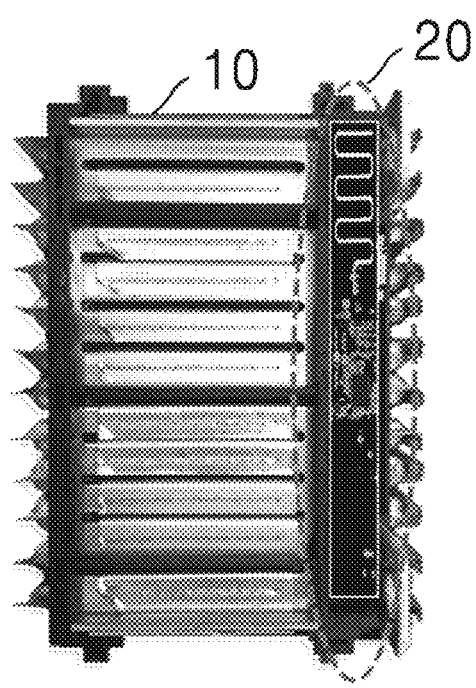

FIGS. 6 to 8 are views exemplarily showing a structure of a battery module 10 and a connection structure between the battery module 10 and the direct BMS 20 according to one embodiment of the present invention.

As shown in FIGS. 6 to 8, the battery module 10 may include a plurality of battery cells 11 that are connected in series to each other, and a positive terminal and a negative terminal may be arranged on one side surface of each of the battery cells 11.

In detail, FIG. 6 is a view schematically showing a configuration in which six battery cells 11 are alternately arranged in one battery module 10 according to one embodiment of the present invention. When assuming that the battery cell disposed at an uppermost portion is a first battery cell 11.1, and the battery cell sequentially disposed at a lowermost portion from the first battery cell 11.1 is a sixth battery cell 11.6, the first battery cell 11.1 to the sixth battery cell 11.6 may be connected in series to form the battery module 10. When a left terminal of the first battery cell 11.1 is a negative terminal, a right terminal of the first battery cell 11.1 is a positive terminal, and a current is introduced into the right positive terminal of the first battery cell 11.1, the left negative terminal of the first battery cell 11.1 may be connected in series to a left positive terminal of a second battery cell, and a right negative terminal of the second battery cell may be connected in series to a right positive terminal of a third battery cell, so that the first battery cell 11.1 to the sixth battery cell 11.6 may be preferably connected in series.

FIG. 7 is a view showing an embodiment of the present invention in which the battery module 10 and the direct BMS 20 physically and electrically make direct contact with each other. The battery module 10 in FIG. 7 has one side surface to which the direct BMS 20 (indicated by an oval dotted line) is physically and electrically attached, so that each of the battery cells 11 and the direct BMS 20 may communicate with each other as shown in FIG. 8.

FIG. 8 is a view showing a connection structure of the battery cells 11 and a connection structure between the battery module 10 and a battery cell connection unit 21. As shown in FIG. 6, the battery cells 11 may be configured such that the positive terminal and the negative terminal are alternately arranged and connected in series so as to form the battery module 10. The positive electrode contact point part 22.1 included in the battery cell connection unit 21 may be connected to the positive terminal of the battery cell 11, and the negative electrode contact point part 22.2 included in the battery cell connection unit 21 may be connected to the negative terminal of the battery cell 11. The electrical signals for the battery cells 11 may be input from the positive terminal and the negative terminal to the positive electrode contact point part 22.1 and the negative electrode contact point part 22.2 corresponding to the battery cell 11, and the battery cell connection unit 21 may transmit the electrical signal to the voltage measurement unit 23 and the current measurement unit 24. The voltage measurement unit 23 may measure the voltage of the battery cell 11 based on the electrical signal, and the current measurement unit 24 may measure the current of the battery cell 11 based on the electrical signal.

Meanwhile, according to another embodiment of the present invention, the battery cells 11 may be randomly arranged without being alternately arranged. However, the battery cells 11 may be connected in series to form the battery module 10. In addition, according to another embodiment of the present invention, unlike the configuration shown in FIG. 8, the number of battery cells 11 is not limited to eight, and less than eight battery cells 11 or at least eight battery cells 11 may be included in the battery module.

Figure 9:
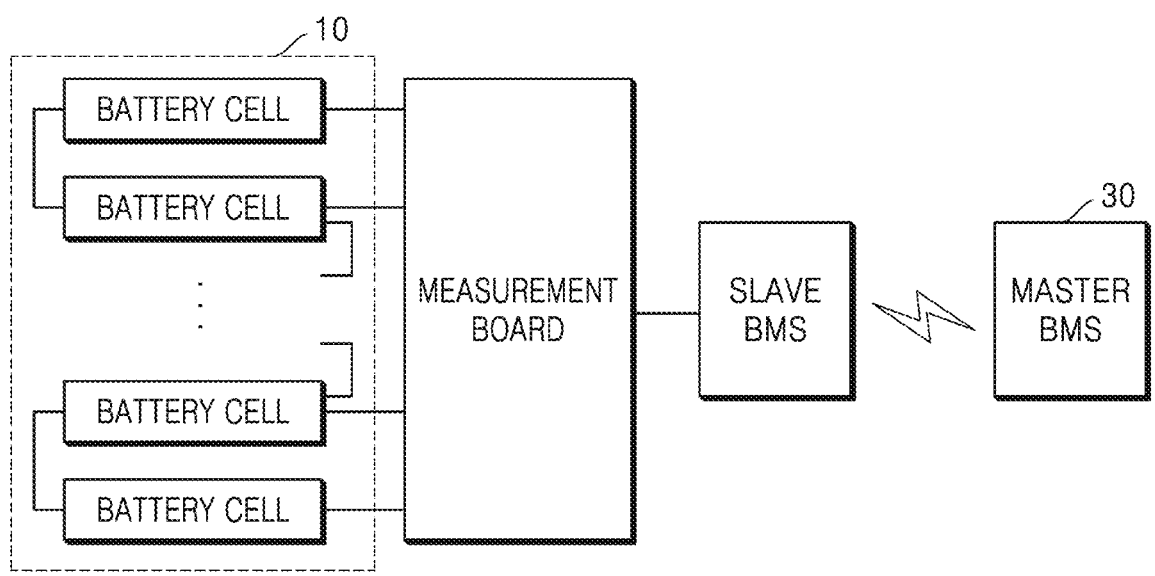
FIG. 9 is a view schematically showing a system for diagnosing a battery cell according to the related art.
Figure 10:
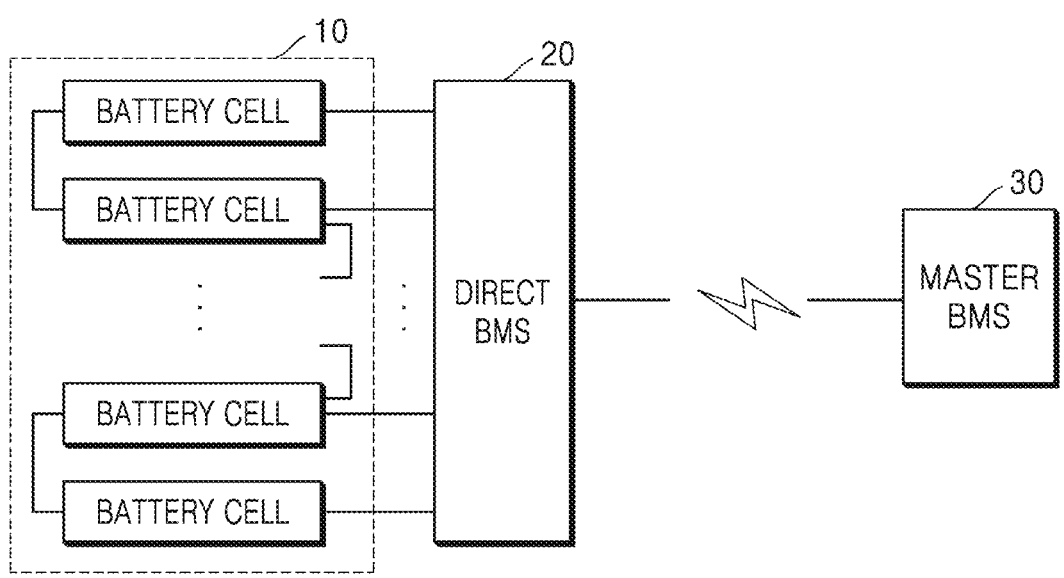
FIG. 10 is a view schematically showing the system for diagnosing the battery cell according to one embodiment of the present invention.

FIG. 9 is a view schematically showing a system for diagnosing a battery cell 11 according to the related art, and FIG. 10 is a view schematically showing the system for diagnosing the battery cell according to one embodiment of the present invention.

As shown in FIG. 9, according to the related art, a system for diagnosing a battery cell 11 may be configured such that a battery module 10 including a plurality of battery cells 11 and a measurement board are connected to each other in a wired manner, and the measurement board is configured to measure a voltage, a current, and a temperature of the battery module 10 as an average voltage, an average current, and an average temperature of the battery cells 11 included in the battery module 10. A slave BMS may transmit the measured voltage, the measured current, and the measured temperature of the battery module 10 to a master BMS 30, and the master BMS 30 may diagnose the entire battery module 10 based on voltage information, current information, and temperature information, which are received.

FIG. 10 is a view showing a configuration in which each of a plurality of battery cells 11 included in the battery module 10 is connected to the direct BMS 20 according to one embodiment of the present invention. In this case, the direct BMS 20 may include all configurations of the measurement board and the slave BMS shown in FIG. 9, so that all functions performed by the measurement board in FIG. 9 and the slave BMS in FIG. 9 may be performed without wired communication requiring separate switching.

In addition, the technical feature of the present invention is that each of the battery cells 11 physically and electrically makes direct contact with a plurality of ports (contact point parts) provided in the direct BMS 20. Since the communication between the battery cell 11 and the direct BMS 20 is not performed through a predetermined signal processing component such as a communication line, the direct BMS 20 may receive a raw electrical signal, which is a current flowing in the battery cell 11 without being interfered with by an external factor, so that the direct BMS 20 may diagnose the battery cell 11 more accurately than a conventional battery cell diagnosis technology for the battery cell 11, and thus the reliability of the diagnosis result of the battery cell 11 may be increased.

In addition, the direct BMS 20 may transmit and receive the electrical signal to and from each of the battery cells 11, measure the voltage of each of the battery cells 11 and the currents of the battery cells, and accurately diagnose the state of each of the battery cells.

The diagnosis unit 26 of the direct BMS 20 may diagnose each of the battery cells 11 by using electrical information of each of the battery cells 11 in the form of raw data without diagnosing the battery cell 11 through an average value of the battery module 10 over a wide range as in the related art.

In addition, in general, the voltage introduced from the battery cell 11 may be mainly a voltage having a high level, and when an electrical signal having a high voltage is transmitted/received, a problem may occur in data, or the direct BMS 20 may have a failure. Therefore, the direct BMS 20 may further include a high-voltage sensor, and when a voltage of the electrical signal received from each of the battery cells 11 exceeds a preset reference, the high-voltage sensor may convert the high voltage into a safe voltage and transmit the electrical signal to the voltage measurement unit 23, the current measurement unit 24, and the temperature measurement unit 25. The voltage measurement unit 23, the current measurement unit 24, and the temperature measurement unit 25 may measure the voltage, the current, and the temperature of the battery cell 11 based on received information. In detail, a correction operation may be performed on the measured voltage to correspond to a conversion operation performed by the high-voltage sensor.

Figure 11:
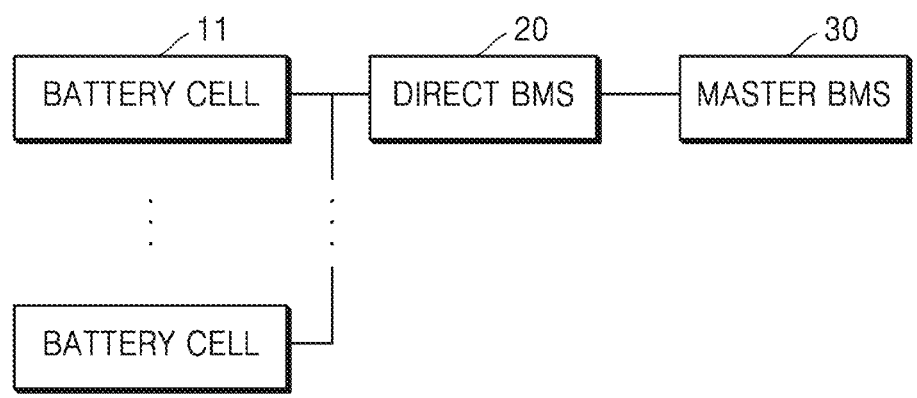
FIG. 11 is a view schematically showing a connection configuration between the battery cell and the direct BMS according to one embodiment of the present invention.
Figure 12:
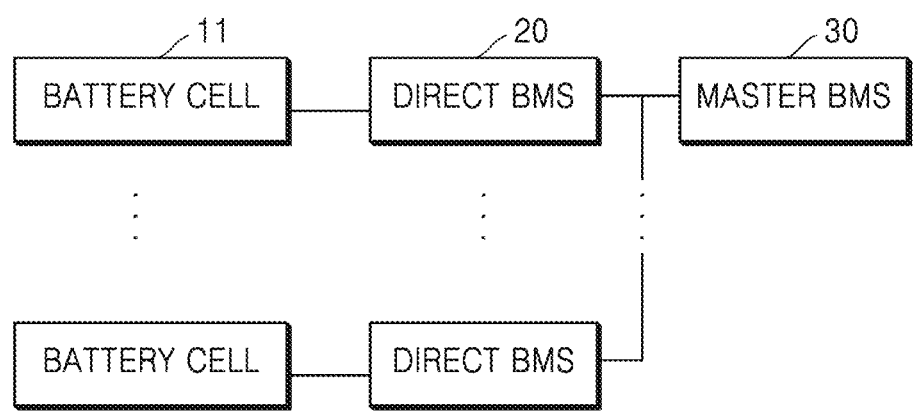
FIG. 12 is a view schematically showing a connection configuration between a battery cell and a direct BMS according to another embodiment of the present invention.

FIGS. 11 and 12 are views schematically showing a connection configuration between a battery cell 11 and a direct BMS 20 according to some embodiments of the present invention.

Schematically, FIG. 11 is a view showing one embodiment of the present invention in which a plurality of battery cells 11 are connected to one direct BMS 20, and FIG. 12 is a view showing another embodiment of the present invention in which one battery cell 11 is connected to one direct BMS 20.

In detail, as shown in FIG. 11, a plurality of battery cells 11 may be connected to one direct BMS 20. The electrodes of the battery cells 11 and the battery cell connection unit 21 of the direct BMS 20 may be physically and electrically attached to each other so as to perform communication. The battery cell connection unit 21 may include a plurality of positive electrode contact point parts 22.1 and a plurality of negative electrode contact point parts 22.2, which are attached to positive and negative terminals of each of the battery cells to transmit and receive electrical signals.

As shown in FIG. 12, one battery cell 11 may be connected to one direct BMS 20. The electrodes of one battery cell 11 and the battery cell connection unit 21 of the direct BMS 20 may be physically and electrically attached to each other so as to perform communication. The battery cell connection unit 21 may include a single positive electrode contact point part 22.1 and a single negative electrode contact point part 22.2, which are attached to positive and negative terminals of a single battery cell to transmit and receive an electrical signal.

The present invention will be described based on the connection configuration shown in FIG. 11.

Figure 14:
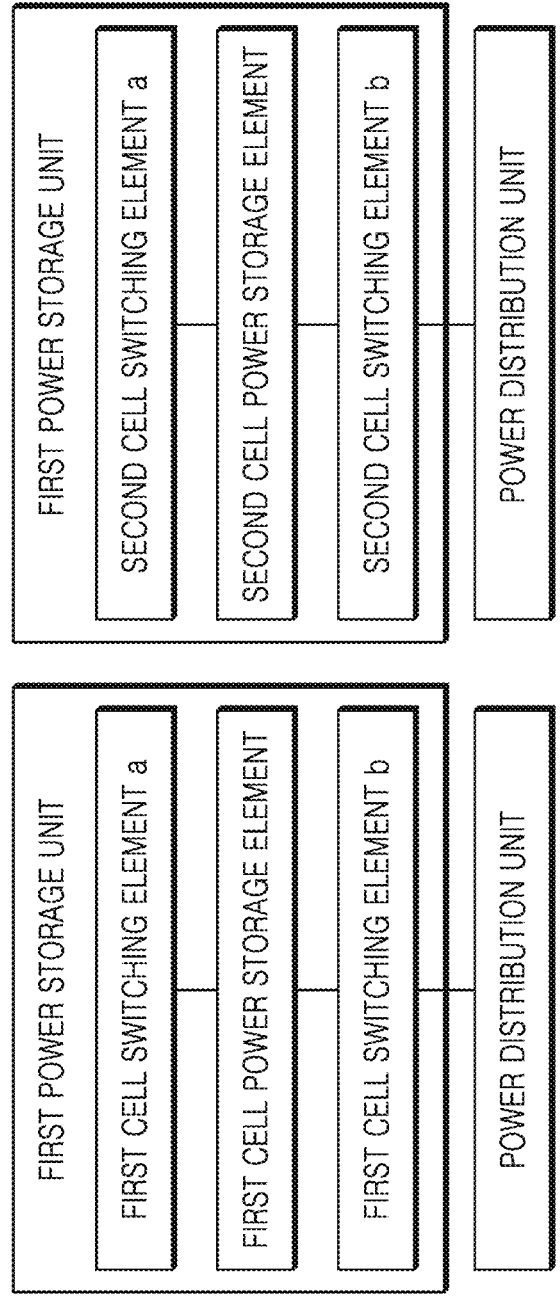

FIGS. 13 and 14 are views schematically showing a configuration of the direct BMS 20 to perform a process of calculating an impedance of each of battery cells 11 through cell balancing according to one embodiment of the present invention.

As shown in FIG. 13, the direct BMS 20 may further include: a cell balancing unit 28 configured to adjust a voltage difference between the battery cells 11 to set the voltages of the battery cells 11 to be equal to each other; and an impedance calculation unit 29 configured to calculate an impedance of each of the battery cells 11 based on the voltage and the current of the battery cell 11. In addition, the direct BMS may be configured as one substrate, and the battery cell connection unit 21, the voltage measurement unit 23, the current measurement unit 24, the temperature measurement unit 25, the diagnosis unit 26, the first wireless communication unit 27, the cell balancing unit 28, and the impedance calculation unit 29 may be configured on the same substrate.

In addition, as shown in FIG. 14, the direct BMS 20 may further include a plurality of cell balancing elements, the cell balancing element may include a cell switching element and a cell power storage element, and the cell balancing elements may perform cell balancing between adjacent battery cells.

The cell balancing unit 28 may include a power storage unit, a power distribution unit, and a switching control unit, and the power storage unit may include at least one cell switching element and at least one cell power storage element. The cell switching element may be a single element such as a diode, transistor, or an IC chip or an SoC in which a logic circuit is programmed, and may be in the form of a module including a plurality of single elements. In addition, the cell power storage element may include at least one element capable of storing a power, such as a capacitor, and may preferably further include a passive element such as an inductor or a resistor.

According to one embodiment of the present invention, the power storage unit may be connected between a positive terminal of a first battery cell 11.1 and a positive terminal of a second battery cell (not shown). When a voltage of the first battery cell 11.1 is measured to be higher than a voltage of the second battery cell so that a power of the first battery cell has to be transmitted to the second battery cell, the cell balancing unit 28 may perform a first charging step of charging a portion of the power stored in the first battery cell 11.1 to the first power storage element by operating a first cell switching element (a first cell switching element a and a first cell switching element b) by the switching control unit. A switch connecting the positive terminal of the first battery cell 11.1 and the first power storage element may be closed, so that the portion of the power of the first battery cell 11.1 may be transmitted to the first cell power storage element. In this case, a charging amount charged in the first cell power storage element may be adjusted through control of the first cell switching element.

When the first cell power storage element is fully charged, the cell balancing unit 28 may perform a second charging step of charging a portion of the power stored in the first battery cell 11.1 to a second cell power storage element by operating the first cell switching element and a second cell switching element (a second cell switching element a and a second cell switching element b) by the switching control unit. Meanwhile, according to one embodiment of the present invention, the second charging step may be performed earlier than the first charging step by operating the switching control unit. In this case, a charging amount charged in the second cell power storage element may be adjusted through control of the second cell switching element. In addition, the cell balancing unit 28 may perform a first discharging step of discharging the power stored in the first cell power storage element and transmitting the power to the power distribution unit by operating the first cell switching element by the switching control unit. The power distribution unit may transmit the power received through the first cell switching element to the second battery cell through the positive terminal of the second battery cell, so that a voltage of the second battery cell may be increased. In this case, a discharging amount of the first power storage element may be adjusted through control of the first cell switching element, and preferably, the power may be transmitted to the power distribution unit by opening and closing the first cell switching element at a specific period.

When the second power storage element is fully charged, the cell balancing unit 28 may perform a second discharging step of discharging the power stored in the second cell power storage element and transmitting the power to the power distribution unit by operating the second cell switching element by the switching control unit. The power received through the second cell switching element may be transmitted to the second battery cell through the positive terminal of the second battery cell, so that the voltage of the second battery cell may be increased. In this case, a discharging amount of the second cell power storage element may be adjusted through control of the second cell switching element, and preferably, the power may be transmitted to the power distribution unit by opening and closing the second cell switching element at a specific period. Through the above series of processes, the cell balancing between the first battery cell 11.1 and the second battery cell may be performed. A cell balancing process between the remaining battery cells may be performed similarly to the cell balancing between the first battery cell 11.1 and the second battery cell.

Figure 15:
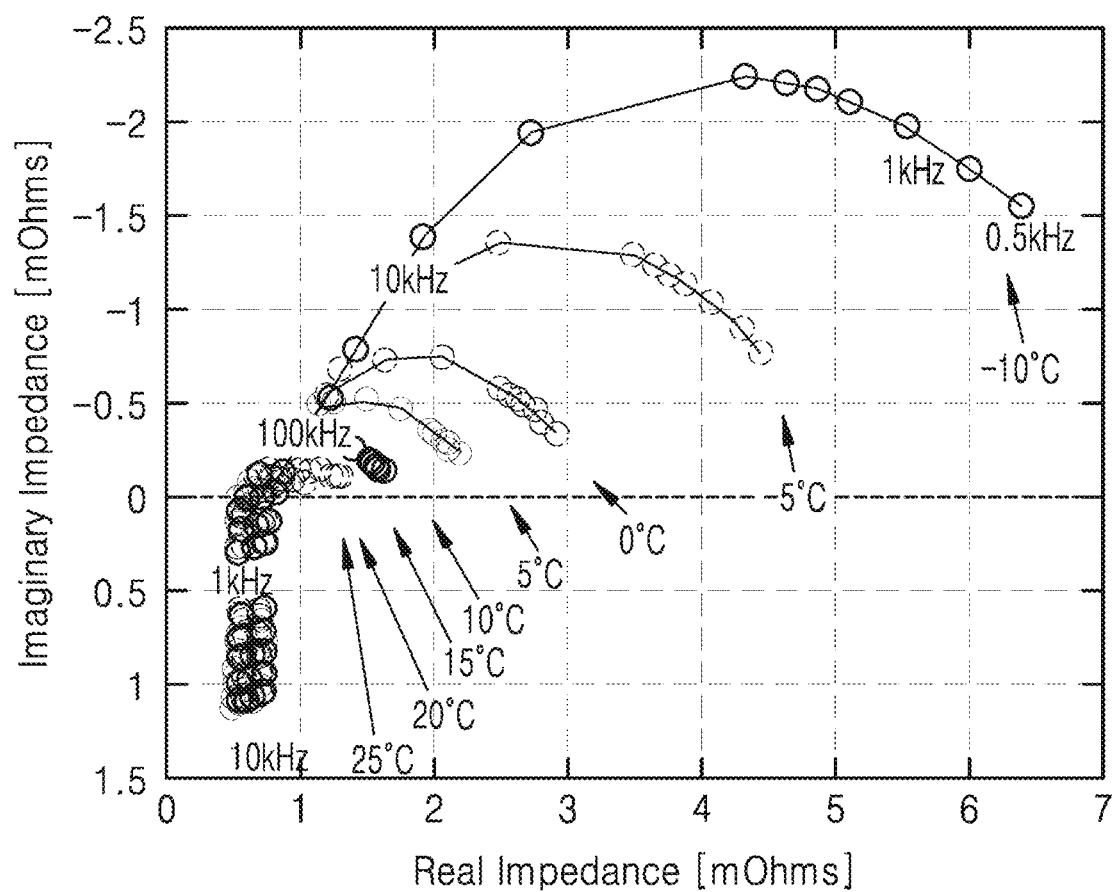
FIG. 15 is a view schematically showing impedance information of the battery cell according to a frequency of an input signal and a temperature according to one embodiment of the present invention.

As described above, the cell balancing unit 28 may repeatedly perform the charging step and the discharging step for the cell power storage element by using the cell switching element, so that the discharging amount in the repeatedly performed discharging step may be variably controlled by operating the cell switching element, and thus an input signal having a specific frequency may be generated. For example, when an operation of closing the cell switching element a for 5 seconds and opening the cell switching element b for 5 seconds is repeatedly performed, the impedance calculation unit 29 may generate an input signal of 100 mHz (=0.1 Hz). In addition, according to one embodiment of the present invention, the power distribution unit may generate an input signal having a completely different frequency by synthesizing a frequency of an input signal generated in the first discharging step and a frequency of an input signal generated in the second discharging step. Referring to FIG. 15, the frequency of the input signal may be one of important parameters for measuring impedance information of the battery cell 11. Hereinafter, a process of measuring the impedance of the battery cell according to the frequency of the input signal will be described below.

The impedance calculation unit 29 may measure the impedance based on the voltage, the current, and the specific frequency. In detail, the impedance calculation unit 29 may calculate the impedance through the input signal having the specific frequency generated during the cell balancing process performed by the cell balancing unit 28. The impedance calculation unit 29 may calculate the impedance by using a trained inference model, the inference model may correspond to a model obtained by pre-training a plurality of pieces of learning data derived from a battery model for calculating the impedance of the battery cell 11 based on a power pattern and an environment condition used in a vehicle, and the impedance information of the battery cell 11 according to the specific frequency may be calculated based on the pieces of learning data, a waveform of an output voltage, and a waveform of an output current. The waveform of the output voltage and the waveform of the output current may be included in the voltage information and the current information received by the direct BMS 20 from the battery cell 11. According to an embodiment of the present invention, the impedance of the cell may be preferably calculated by using only the waveform of the output voltage and the waveform of the output current. Meanwhile, according to another embodiment of the present invention, the temperature information obtained through the temperature measurement unit 25 may be used to calculate the impedance of the cell. A battery cell refers to a device configured to generate electricity through a chemical reaction, and entrance and exit of heat may be accompanied during such a process, so that battery performance may be closely related to a temperature. In fact, referring to FIG. 15, it may be found that the impedance information varies according to the temperature.

Referring to FIG. 15, when a waveform of the impedance information is analyzed, a current state and a defect of the battery cell 11 may be diagnosed. Since the impedance information is a value that varies according to a frequency, a separate measurement device is generally required to measure the impedance. However, according to the present invention, the impedance of each of the battery cells 11 may be measured through the input signal generated in the cell balancing process without a separate measurement device, and the diagnosis result and the like of the battery cell 11 may be calculated through the measured impedance so as to be provided to a user.

Figure 16:
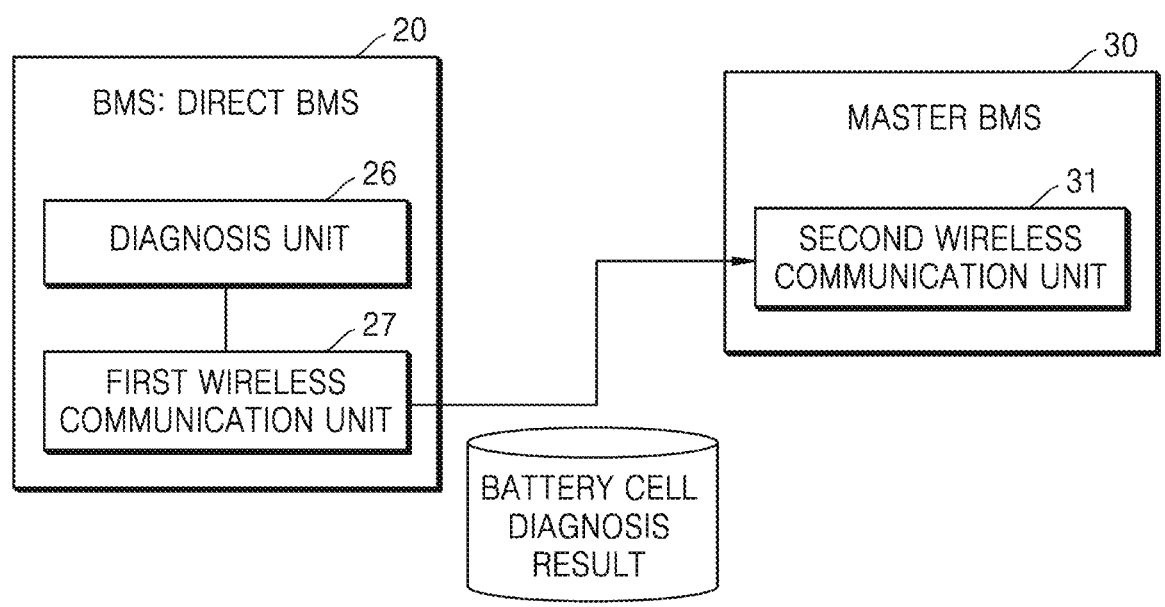
FIG. 16 is a view schematically showing a process performed by a diagnosis unit and a first wireless communication unit according to one embodiment of the present invention.

FIG. 16 is a view schematically showing a process performed by a diagnosis unit 26 and a first wireless communication unit 27 according to one embodiment of the present invention.

As shown in FIG. 16, both the positive terminal and the negative terminal of the battery cell 11 may make direct contact with the port provided in the battery cell connection unit 21, the voltage, the current, and the temperature of the battery cell 11 may be measured, the state of the battery cell 11 may be diagnosed, and the diagnosis result of each of the battery cells 11 may be transmitted to the master BMS 30.

In addition, the direct BMS 20 may analyze the voltage of each of the battery cells 11 and the current of the battery cell 11 to measure an impedance of each of the battery cells 11, perform fire diagnosis based on the impedance of each of the battery cells 11, and transmit a fire diagnosis result to the master BMS 30.

In detail, the diagnosis unit 26 may diagnose each of the battery cells 11 based on the voltage information and the current information corresponding to the battery cell 11 such as an overvoltage (overcharging) when the voltage of the battery cell 11 exceeds a preset maximum voltage reference, an undervoltage (overdischarging) when the voltage of the battery cell 11 is less than a preset minimum voltage reference, and an overcurrent when the current of the battery cell 11 exceeds a preset maximum current reference, and may diagnose overheating and the like of each of the battery cells 11 based on the temperature measurement. In addition, the impedance information of the battery cell 11 calculated based on the voltage information and the current information may be received. Since an impedance is a main factor in outbreak of a battery fire, a battery cell 11 having a high impedance may be overheated during discharging so as to ignite or explode, so that the diagnosis unit 26 may constantly measure the impedance to diagnose abnormality of the battery cell 11.

The direct BMS may be attached to the positive and negative terminals of each of the battery cells to measure the voltage and the current of the battery cell 11, so that the reliability of the diagnosis result of the battery cell 11 may become higher than reliability of the related art for measuring the average voltage and the average current of the battery cells 11 included in the battery module 10. In addition, according to one embodiment of the present invention, when abnormality is found in performance of at least one battery cell 11 of the battery module 10, the battery cell having the abnormality may be rapidly extracted, so that deterioration in performance and lifespans of all the battery cells 11, such as an excessive increase in charging voltages of the remaining battery cells 11 included in the battery module 10, may be prevented.

According to one embodiment of the present invention, the direct BMS may physically and electrically make direct contact with the battery cells to receive electrical signals, so that a noise can be prevented from being generated by channel switching in wired communication, and thus reliability of data received from the battery cells can be increased.

According to one embodiment of the present invention, the direct BMS may physically and electrically make direct contact with the battery cells to receive the electrical signals, so that an uncorrectable noise can be prevented from being generated by mutually different voltages of the battery cells, and thus the reliability of the data received from the battery cells can be increased.

According to one embodiment of the present invention, each electrode of the battery cell may be connected to the port of the battery cell connection unit of the direct BMS to measure the voltage corresponding to each of the battery cells. In this case, a wire in which electromagnetic interference occurs can be eliminated, so that accuracy of the data for each of the battery cells can be increased, and a user can rapidly take action on a battery cell that is determined to have a problem as a result of diagnosing each of the battery cells.

According to one embodiment of the present invention, the impedance corresponding to each of the battery cells may be measured through cell balancing, and the state of the battery cell may be diagnosed based on the measured impedance, so that the user can prepare for an accident such as battery explosion.

According to one embodiment of the present invention, the battery module and direct BMS may be physically connected to each other, so that the system for diagnosing the battery cell can have improved durability against vibration as compared with a conventional battery management system, resulting in extension of a lifespan of a battery, and reliability of data that is transmitted and received can also be increased.

Although the above embodiments have been described with reference to the limited embodiments and drawings, however, it will be understood by those skilled in the art that various changes and modifications may be made from the above-mentioned description. For example, even though the described descriptions may be performed in an order different from the described manner, and/or the described components such as system, structure, device, and circuit may be coupled or combined in a form different from the described manner, or replaced or substituted by other components or equivalents, appropriate results may be achieved.

Therefore, other implementations, other embodiments, and equivalents to the claims are also within the scope of the following claims.

What is claimed is:

1. A system for diagnosing a battery cell, which is located inside a vehicle, the system comprising:
   a plurality of direct battery management systems (BMSs) located inside the vehicle, and electrically connected to a plurality of battery cells included in a battery module, each of the plurality of battery cells having positive and negative electrode terminals on one side surface; and
   a master BMS located inside the vehicle, and configured to perform wireless communication with the direct BMS,
   wherein the direct BMS includes:
   a battery cell connection unit including a port physically and electrically making direct contact with the battery module with exposed electrode terminals of the plurality of battery cells, wherein the port comprises a group of pairs of conductive members, each pair arranged for each battery cell in parallel in that a first conductive member of the pair directly contacts the positive electrode terminal of the battery cell without an intervening wire, and a second conductive member of the pair directly contacts the negative electrode terminal of the battery cell without an intervening wire, allowing direct measurement of electrical properties of the battery;
   a voltage measurement unit electrically connected to the battery cell connection unit to measure a voltage of the battery cell in a form of a circuit;
   a current measurement unit electrically connected to the battery cell connection unit to measure a current of the battery cell in a form of a circuit;
   a diagnosis unit configured to diagnose abnormality of the battery cell based on voltage information, current information, and temperature information, which are measured; and
   a first wireless communication unit configured to transmit a diagnosis result of the diagnosis unit to the master BMS, and
   the diagnosis result transmitted from the first wireless communication unit is received by a second wireless communication unit of the master BMS.

2. The system of claim 1, wherein the battery cell connection unit configured to:
   measure the voltage of each of the battery cells and the current of each of the battery cells,
   diagnose a state of each battery cell, and
   transmit the diagnosis result of each of the battery cells is transmitted to the master BMS.

3. The system of claim 2, wherein the direct BMS is further configured to:
   analyze the voltage of each of the battery cells and the current of the battery cell to measure an impedance of each of the battery cells;
   perform fire diagnosis based on information including the impedance of each of the battery cells; and
   transmit a fire diagnosis result to the master BMS.

4. The system of claim 1, wherein the direct BMS further includes:
   a cell balancing unit configured to adjust a voltage difference between the battery cells to set the voltages of the battery cells to be equal to each other; and
   an impedance calculation unit configured to calculate an impedance of each of the battery cells based on the voltage and the current of the battery cell.

5. The system of claim 4, wherein the direct BMS is configured as one substrate, and
   the battery cell connection unit, the voltage measurement unit, the current measurement unit, a temperature measurement unit, the diagnosis unit, the first wireless communication unit, the cell balancing unit, and the impedance calculation unit are configured on a same substrate.

6. The system of claim 1, wherein the direct BMS further includes a plurality of cell balancing elements,
   the cell balancing element includes a cell switching element and a cell power storage element, and the cell balancing elements are configured to perform cell balancing between adjacent battery cells.

* * * * *